(12) United States Patent
Wang et al.

(10) Patent No.: US 9,444,500 B2
(45) Date of Patent: Sep. 13, 2016

(54) MODULATION CIRCUIT OF DIGITAL TRANSMITTER, DIGITAL TRANSMITTER, AND SIGNAL MODULATION METHOD

(71) Applicant: Huawei Technologies Co., Ltd., Shenzhen (CN)

(72) Inventors: Wufeng Wang, Shenzhen (CN); Min Yi, Shanghai (CN); Nianyong Zhu, Shanghai (CN); Bingxuan Mo, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/744,142

(22) Filed: Jun. 19, 2015

(65) Prior Publication Data
US 2015/0372701 A1    Dec. 24, 2015

(30) Foreign Application Priority Data

Jun. 24, 2014  (CN) .......................... 2014 1 0287141

(51) Int. Cl.
*H04B 1/04* (2006.01)
*H04L 27/36* (2006.01)
(Continued)

(52) U.S. Cl.
CPC .......... *H04B 1/0475* (2013.01); *H04L 27/364* (2013.01); *H03L 7/00* (2013.01); *H04L 7/0331* (2013.01); *H04L 7/0337* (2013.01)

(58) Field of Classification Search
CPC ..... H03L 7/0814; H03L 7/00; H04L 7/0091; H04L 27/364; H04B 1/0475
See application file for complete search history.

(56) References Cited

U.S. PATENT DOCUMENTS

| 2003/0058050 A1* | 3/2003 | Kuiri | ....................... H03F 3/211 330/295 |
| 2006/0038710 A1* | 2/2006 | Staszewski | ............... H03F 3/24 341/143 |

(Continued)

FOREIGN PATENT DOCUMENTS

| CN | 1870614 A | 11/2006 |
| CN | 104052710 A | 9/2014 |

(Continued)

OTHER PUBLICATIONS

Lu et al., "A 24.7dBm all-digital RF transmitter for multimode broadband applications in 40nm CMOS," in Solid-State Circuits Conference Digest of Technical Papers (ISSCC), 2013 IEEE International, vol., No., pp. 332-333, Feb. 17-21, 2013.*

(Continued)

*Primary Examiner* — Chieh M Fan
*Assistant Examiner* — Michelle M Koeth
(74) *Attorney, Agent, or Firm* — Leydig, Voit & Mayer, Ltd.

(57) ABSTRACT

The present invention relates to a modulation circuit of a digital transmitter, a digital transmitter, and a signal modulation method. The modulation circuit includes: a first synchronizing circuit and a digital modulator, where the first synchronizing circuit separately perform phase delay on a first local-frequency signal or a second local-frequency signal to obtain corresponding delay signals, and perform phase adjustment on a digital baseband signal by using the delay signals, to generate a first adjusted signal and a second adjusted signal; and the digital modulator modulates the first adjusted signal by using the first local-frequency signal, to generate a first radio-frequency signal, and modulates the second adjusted signal by using the second local-frequency signal, to generate a second radio-frequency signal.

13 Claims, 10 Drawing Sheets

(51) Int. Cl.
*H03L 7/00* (2006.01)
*H04L 7/033* (2006.01)

(56) References Cited

U.S. PATENT DOCUMENTS

| | | |
|---|---|---|
| 2008/0095264 A1 | 4/2008 | Deng et al. |
| 2009/0253398 A1 | 10/2009 | Sheehy et al. |
| 2010/0105338 A1* | 4/2010 | Wang .................. H03F 1/3241 455/73 |
| 2010/0128775 A1 | 5/2010 | Kim et al. |
| 2010/0171540 A1 | 7/2010 | Beale et al. |
| 2013/0259158 A1* | 10/2013 | Zarei .................. H04L 25/03 375/296 |

FOREIGN PATENT DOCUMENTS

| | | |
|---|---|---|
| EP | 1338085 B1 | 2/2009 |
| EP | 1875700 B1 | 7/2009 |
| EP | 2266208 B1 | 10/2011 |

OTHER PUBLICATIONS

"All Digital-Quadrature-Modulator Based Wideband Wireless Transmitters," IEEE Transactions on Circuits and Systems—I: Regular Papers, vol. 56, No. 11, pp. 2487-2497, Institute of Electrical and Electronics Engineers, New York, New York (Nov. 2009).

Li et al., "Efficient Self-Correction Scheme for Static Non-Idealities in Nano-Scale Quadrature Digital RF Transmitters," 2013 IEEE Workshop on Signal Processing Systems, Institute of Electrical and Electronics Engineers, New York, New York (Oct. 16-18, 2013).

Wang et al., "A Highly-Efficient Multi-Band Multi-Mode Digital Quadrature Transmitter with 2D Pre-Distortion," 2013 IEEE International Symposium on Circuits and Systems, Institute of Electrical and Electronics Engineers, New York, New York (May 19-23, 2013).

Chowdhury et al., "An Efficient Mixed-Signal 2.4-GHz Polar Power Amplifier in 65-nm CMOS Technology," IEEE Journal of Solid-State Circuits, vol. 46, No. 8, pp. 1796-1809 Institute of Electrical and Electronics Engineers, New York, New York (Aug. 2011).

* cited by examiner

Unnecessary high-frequency harmonic component

MODULATION CIRCUIT OF DIGITAL TRANSMITTER, DIGITAL TRANSMITTER, AND SIGNAL MODULATION METHOD

CROSS-REFERENCE TO RELATED APPLICATION

This application claims priority to Chinese Patent Application No. 201410287141.6, filed on Jun. 24, 2014, which is hereby incorporated by reference in its entirety.

TECHNICAL FIELD

The present invention relates to the field of wireless communications technologies, and in particular, to a modulation circuit of a digital transmitter, a digital transmitter, and a signal modulation method.

BACKGROUND

Currently, mainstream digital transmitters are classified into a digital cartesian transmitter (DCT) and a digital polar transmitter (DPT), and both types of digital transmitters include a digital modulator capable of modulating a digital baseband signal to a radio-frequency signal.

An existing digital modulator usually modulates a digital baseband signal (BB) and a local-frequency signal (LO) by using a logic gate (AND gate). As shown in FIG. 1, in order to ensure that a modulated radio-frequency signal RF_data achieves an ideal waveform, phases of a digital baseband signal BB and a local-frequency signal (LO) need to be well controlled before the digital baseband signal BB and the local-frequency signal LO enter the logic gate. After edges of the digital baseband signal BB and the local-frequency signal LO are aligned, a logical AND operation is performed, so that the modulated radio-frequency signal RF_data may achieve the ideal waveform.

However, in fact, in a case in which a frequency of the local-frequency signal LO and a data rate of the digital baseband signal BB reach up to GHz (G samples/s), and in a case in which there are voltage, temperature, and technique deviations, it is very difficult to align the edges of the digital baseband signal BB and the local-frequency signal LO. As shown in FIG. 2, the logical AND operation is performed in a case in which the edges of the digital baseband signal BB and the local-frequency signal LO are not aligned, and consequently, the modulated radio-frequency signal RF_data may generate an unnecessary high-frequency harmonic component, which causes phase noise that comes from the digital baseband signal BB.

SUMMARY

In view of this, embodiments of the present invention provide a modulation circuit of a digital transmitter, a digital transmitter, and a signal modulation method, which can prevent a modulated radio-frequency signal from generating an unnecessary high-frequency harmonic component, and can effectively suppress phase noise that comes from a digital baseband signal.

According to a first aspect, an embodiment of the present invention provides a modulation circuit of a digital transmitter, where the modulation circuit includes: a first synchronizing circuit and a digital modulator, and the first synchronizing circuit includes: a first synchronizing unit and a second synchronizing unit, where the first synchronizing unit is configured to separately receive a first digital baseband signal and a first local-frequency signal, perform phase delay on the first local-frequency signal to obtain a first delay signal, and perform phase adjustment on the first digital baseband signal by using the first delay signal, to generate a first adjusted signal, so that both a rising edge and a falling edge of the first adjusted signal fall in a low level range of the first local-frequency signal;

the second synchronizing unit is configured to separately receive the first digital baseband signal and a second local-frequency signal, perform phase delay on the second local-frequency signal to obtain a second delay signal, and perform phase adjustment on the first digital baseband signal by using the second delay signal, to generate a second adjusted signal, so that a rising edge and a falling edge of the second adjusted signal fall in a low level range of the second local-frequency signal, where the first local-frequency signal and the second local-frequency signal are differential signals, and phase delays of the first delay signal and the second delay signal are the same; and the digital modulator is configured to separately modulate the first adjusted signal by using the first local-frequency signal, to generate a first radio-frequency signal, and modulate the second adjusted signal by using the second local-frequency signal, to generate a second radio-frequency signal.

In a first possible implementation manner, the first synchronizing unit includes: a first delayer and a first D flip flop, where the first delayer is configured to perform phase delay on the first local-frequency signal to obtain the first delay signal, and input the first delay signal to the first D flip flop as a first clock signal; and the first D flip flop performs phase adjustment on the first digital baseband signal according to triggering of the first clock signal, to output the first adjusted signal; and the second synchronizing unit includes: a second delayer and a second D flip flop, where the second delayer is configured to perform phase delay on the second local-frequency signal to obtain the second delay signal, and input the second delay signal to the second D flip flop as a second clock signal; and the second D flip flop performs phase adjustment on the first digital baseband signal according to triggering of the second clock signal, to output the second adjusted signal.

With reference to the first aspect or the first possible implementation manner of the first aspect, in a second possible implementation manner, the digital modulator includes a first digital modulating unit and a second digital modulating unit, where the first digital modulating unit is configured to receive the first local-frequency signal and the first adjusted signal, and perform a logical AND operation on the first local-frequency signal and the first adjusted signal to output the first radio-frequency signal; and the second digital modulating unit is configured to receive the second local-frequency signal and the second adjusted signal, and perform a logical AND operation on the second local-frequency signal and the second adjusted signal to output the second radio-frequency signal.

In a third possible implementation manner, the modulation circuit further includes: a second synchronizing circuit, and the second synchronizing circuit includes: a third synchronizing unit and a fourth synchronizing unit, where the third synchronizing unit is configured to separately receive a second digital baseband signal and the first local-frequency signal, perform phase delay on the first local-frequency signal to obtain a third delay signal, and perform phase adjustment on the second digital baseband signal by using the third delay signal, to generate a third adjusted signal, so that a rising edge and a rising edge of the third adjusted signal fall in the low level range of the first local-frequency signal;

the fourth synchronizing unit is configured to separately receive the second digital baseband signal and the second local-frequency signal, perform phase delay on the second local-frequency signal to obtain a fourth delay signal, and perform phase adjustment on the digital baseband signal by using the fourth delay signal, to generate a fourth adjusted signal, so that a rising edge and a falling edge of the fourth adjusted signal fall in the low level range of the second local-frequency signal, where the first digital baseband signal and the second digital baseband signal are differential signals, and phase delays of the third delay signal and the fourth delay signal are the same; and the digital modulator is further configured to separately modulate the third adjusted signal by using the first local-frequency signal, to generate a third radio-frequency signal, and modulate the fourth adjusted signal by using the second local-frequency signal, to generate a fourth radio-frequency signal; and overlap the first radio-frequency signal and the fourth radio-frequency signal, to obtain a first radio-frequency output signal, and overlap the second radio-frequency signal and the third radio-frequency signal, to obtain a second radio-frequency output signal.

With reference to the third possible implementation manner of the first aspect, in a fourth possible implementation manner, the third synchronizing unit includes: a third delayer and a third D flip flop, where the third delayer is configured to perform phase delay on the first local-frequency signal to obtain a third delay signal, and input the third delay signal to the third D flip flop as a third clock signal; and the third D flip flop is configured to perform phase adjustment on the second digital baseband signal according to triggering of the third clock signal, to output the third adjusted signal; and the fourth synchronizing unit includes: a fourth delayer and a fourth D flip flop, where the fourth delayer is configured to perform phase delay on the second local-frequency signal to obtain a fourth delay signal, and input the fourth delay signal to the fourth D flip flop as a fourth clock signal; and the fourth D flip flop is configured to perform phase adjustment on the second digital baseband signal according to triggering of the fourth clock signal, to output the fourth adjusted signal.

With reference to the third and fourth possible implementation manners of the first aspect, in a fifth possible implementation manner, the digital modulator includes a third digital modulating unit and a fourth digital modulating unit, where the third digital modulating unit includes a first AND logic unit, a second AND logic unit, and a first OR logic unit, where the first AND logic unit is configured to perform a logical AND operation on the first local-frequency signal and the first adjusted signal that are input, to generate the first radio-frequency signal; the second AND logic unit is configured to perform a logical AND operation on the second local-frequency signal and the fourth adjusted signal, to generate the fourth radio-frequency signal; and the first OR logic unit is configured to perform a logical OR operation on the first radio-frequency signal and the fourth radio-frequency signal, to output the first radio-frequency output signal; and the fourth digital modulating unit includes a third AND logic unit, a fourth AND logic unit, and a second OR logic unit, where the third AND logic unit is configured to perform a logical AND operation on the first local-frequency signal and the third adjusted signal that are input, to generate the second radio-frequency signal; the fourth AND logic unit is configured to perform a logical AND operation on the second local-frequency signal and the second adjusted signal that are input, to generate the third radio-frequency signal; and the second OR logic unit is configured to perform a logical OR operation on the second radio-frequency signal and the third radio-frequency signal, to output the second radio-frequency output signal.

With reference to the first or the fourth possible implementation manner of the first aspect, in a sixth possible implementation manner, any one of the D flip flops is a D flip flop triggered by a clock signal rising edge.

According to a second aspect, an embodiment of the present invention provides a digital transmitter, including:

an amplitude-phase separation module, configured to perform amplitude-phase separation on two input quadrature signals, to generate an amplitude modulation AM signal and a phase modulation PM signal;

an AM signal processing module, configured to process the AM signal, to generate a digital baseband signal;

a digital phase locked loop, configured to modulate the PM signal, to generate a first local-frequency signal and a second local-frequency signal, where the first local-frequency signal and the second local-frequency signal are differential signals;

the modulation circuit of the digital transmitter described in the foregoing first aspect, configured to generate a first radio-frequency signal and a second radio-frequency signal according to the first digital baseband signal, the first local-frequency signal, and the second local-frequency signal; and a digital-to-analog conversion circuit, configured to receiving the first radio-frequency signal and the second radio-frequency signal that are differentially input, and convert the first radio-frequency signal and the second radio-frequency signal into an analog signal for output.

According to a third aspect, an embodiment of the present invention provides a digital transmitter, including:

a first digital signal processor, configured to receive first input signals that are differentially input, and generate a first digital baseband signal and a second digital baseband signal;

a second digital signal processor, configured to receive second input signals that are differentially input, and generate a third digital baseband signal and a fourth digital baseband signal, where the first input signals and the second input signals are in-phase and quadrature signals;

a digital phase locked loop, configured to generate a first group of local-frequency signals and a second group of local-frequency signals, where the first group of local-frequency signals is orthogonal to the second group of local-frequency signals, the first group of local-frequency signals includes a first local-frequency signal and a second local-frequency signal that are differential to each other; and the second group of local-frequency signals includes a third local-frequency signal and a fourth local-frequency signal that are differential to each other;

a first modulation circuit, configured to receive the first digital baseband signal, the second digital baseband signal, the first local-frequency signal, and the second local-frequency signal; perform phase delay on the first local-frequency signal, and then perform phase adjustment on the first digital baseband signal, to generate a first adjusted signal, so that a rising edge and a falling edge of the first adjusted signal fall in a low level range of the first local-frequency signal; perform phase delay on the second local-frequency signal, and then perform phase adjustment on the first digital baseband signal, to generate a second adjusted signal, so that a rising edge and a falling edge of the second adjusted signal fall in a low level range of the second local-frequency signal; perform phase delay on the first local-frequency signal, and then perform phase adjustment on the second digital baseband signal, to generate a third adjusted signal, so that a rising edge and a rising edge of the third adjusted signal fall in the low level range of the first local-frequency signal; perform phase delay on the second local-frequency signal, and then perform phase adjustment on the second digital baseband signal, to generate a fourth adjusted signal, so that a rising edge and a falling edge of the fourth adjusted signal fall in the low level range of the second local-frequency signal; modulate the first adjusted signal by using the first local-frequency signal, to generate a first radio-frequency signal; modulate the second adjusted signal by using the second local-frequency signal, to generate a second radio-frequency signal; modulate the third adjusted signal by using the first local-frequency signal, to generate a third radio-frequency signal; modulate the fourth adjusted signal by using the second local-frequency signal, to generate a fourth radio-frequency signal; overlap the first radio-frequency signal and the fourth radio-frequency signal, to obtain a first radio-frequency output signal; and overlap the second radio-frequency signal and the third radio-frequency signal, to obtain a second radio-frequency output signal;

a second modulation circuit, configured to receive the third digital baseband signal, the fourth digital baseband signal, the third local-frequency signal, and the fourth local-frequency signal; perform phase delay on the third local-frequency signal, and then perform phase adjustment on the third digital baseband signal, to generate a fifth adjusted signal, so that a rising edge and a falling edge of the fifth adjusted signal fall in a low level range of the third local-frequency signal; perform phase delay on the fourth local-frequency signal, and then perform phase adjustment on the third digital baseband signal, to generate a sixth adjusted signal, so that a rising edge and a falling edge of the sixth adjusted signal fall in a low level range of the fourth local-frequency signal; perform phase delay on the third local-frequency signal, and then perform phase adjustment on the fourth digital baseband signal, to generate a seventh adjusted signal, so that a rising edge and a falling edge of the seventh adjusted signal fall in the low level range of the third local-frequency signal; perform phase delay on the fourth local-frequency signal, and then perform phase adjustment on the fourth digital baseband signal, to generate an eighth adjusted signal, so that a rising edge and a falling edge of the eighth adjusted signal fall in the low level range of the fourth local-frequency signal; modulate the fifth adjusted signal by using the third local-frequency signal, to generate a fifth radio-frequency signal; modulate the sixth adjusted signal by using the fourth local-frequency signal, to generate a sixth radio-frequency signal; modulate the seventh adjusted signal by using the third local-frequency signal, to generate a seventh radio-frequency signal; modulate the eighth adjusted signal by using the fourth local-frequency signal, to generate an eighth radio-frequency signal; overlap the fifth radio-frequency signal and the eighth radio-frequency signal, to obtain a third radio-frequency output signal, and overlap the sixth radio-frequency signal and the seventh radio-frequency signal, to obtain a fourth radio-frequency output signal;

a first radio-frequency digital-to-analog converter, configured to converting the first radio-frequency output signal and the second radio-frequency output signal into a first analog signal for output; and a second radio-frequency digital-to-analog converter, configured to converting the third radio-frequency output signal and the fourth radio-frequency output signal into a second analog signal for output.

According to a fourth aspect, an embodiment of the present invention provides a signal modulation method, including:

receiving a first digital baseband signal and a first local-frequency signal, performing phase delay on the first local-frequency signal to obtain a first delay signal, and performing phase adjustment on the digital baseband signal by using the first delay signal, to generate a first adjusted signal, so that a rising edge and a falling edge of the first adjusted signal fall in a low level range of the first local-frequency signal;

receiving the first digital baseband signal and a second local-frequency signal, performing phase delay on the second local-frequency signal to obtain a second delay signal, and performing phase adjustment on the digital baseband signal by using the second delay signal, to generate a second adjusted signal, so that a rising edge and a falling edge of the second adjusted signal fall in a low level range of the second local-frequency signal, where the first local-frequency signal and the second local-frequency signal are differential signals, and phase delays of the first delay signal and the second delay signal are the same; and modulating the first adjusted signal by using the first local-frequency signal, to generate a first radio-frequency signal, and modulating the second adjusted signal by using the second local-frequency signal, to generate a second radio-frequency signal.

In a first possible implementation manner, the method further includes:

receiving a second digital baseband signal and the first local-frequency signal, performing phase delay on the first local-frequency signal to obtain a third delay signal, and performing phase adjustment on the second digital baseband signal by using the third delay signal, to generate a third adjusted signal, so that a rising edge and a rising edge of the third adjusted signal fall in the low level range of the first local-frequency signal;

receiving the second digital baseband signal and the second local-frequency signal, performing phase delay on the second local-frequency signal to obtain a fourth delay signal, and performing phase adjustment on the second digital baseband signal by using the fourth delay signal, to generate a fourth adjusted signal, so that a rising edge and a falling edge of the fourth adjusted signal fall in the low level range of the second local-frequency signal, where the first digital baseband signal and the second digital baseband signal are differential signals, and phase delays of the third delay signal and the fourth delay signal are the same; and modulating the third adjusted signal by using the first local-frequency signal, to generate a third radio-frequency signal, and modulating the fourth adjusted signal by using the second local-frequency signal, to generate a fourth radio-frequency signal; and overlapping the first radio-frequency signal and the fourth radio-frequency signal, to obtain a first radio-frequency output signal, and overlapping the second radio-frequency signal and the third radio-frequency signal, to obtain a second radio-frequency output signal.

In the modulation circuit of a digital transmitter provided by the embodiments of the present invention, a first synchronizing unit performs phase delay on a first local-frequency signal, and adjusts a phase of a first digital baseband signal, so that a rising edge and a falling edge of a generated first adjusted signal fall in a low level range of the first local-frequency signal; a second synchronizing unit performs phase delay on a second local-frequency signal, and adjusts the phase of the first digital baseband signal, so that a rising edge and a falling edge of a generated second adjusted signal fall in a low level range of the second local-frequency signal; then, a digital modulator modulates the first adjusted signal by using the first local-frequency signal, to generate a first radio-frequency signal, and modulates the second adjusted signal by using the second local-frequency signal, to generate a second radio-frequency signal. The modulation circuit of a digital transmitter provided by the present invention can prevent a modulated radio-frequency signal from generating an unnecessary high-frequency harmonic component, and can effectively suppress phase noise that comes from a digital baseband signal.

DESCRIPTION OF EMBODIMENTS

To make the objectives, technical solutions, and advantages of the present invention clearer, the following further describes the present invention in detail with reference to the accompanying drawings. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
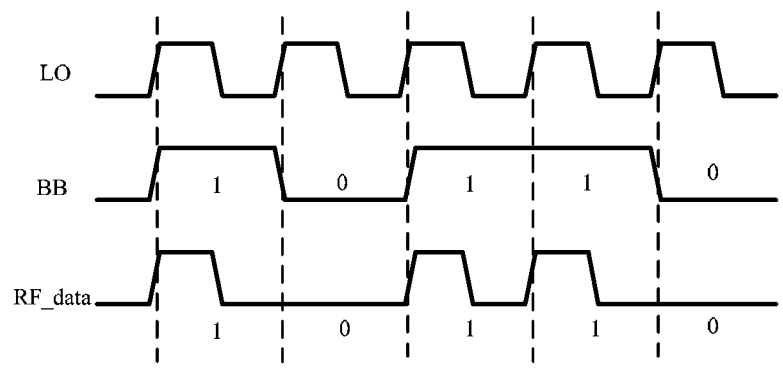
FIG. 1 is a schematic diagram of an ideal waveform of input and output signals of an existing digital modulator.
Figure 2:
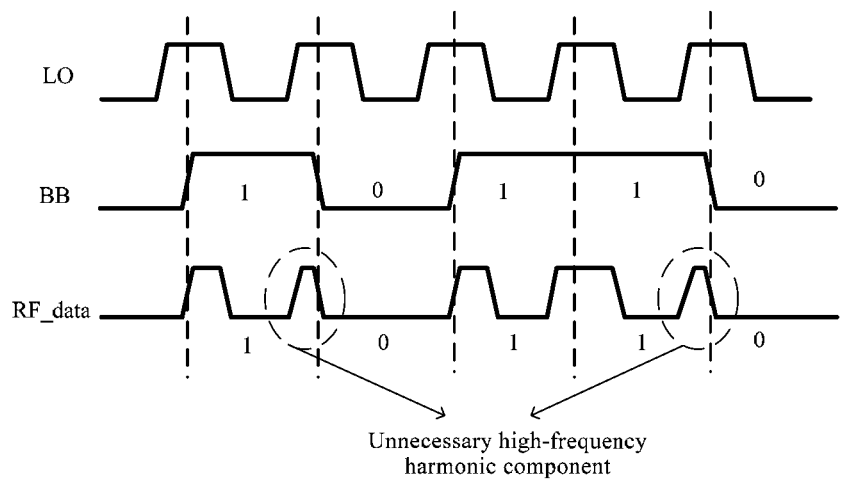
FIG. 2 is a schematic diagram of an actual waveform of input and output signals of an existing digital modulator.
Figure 3:
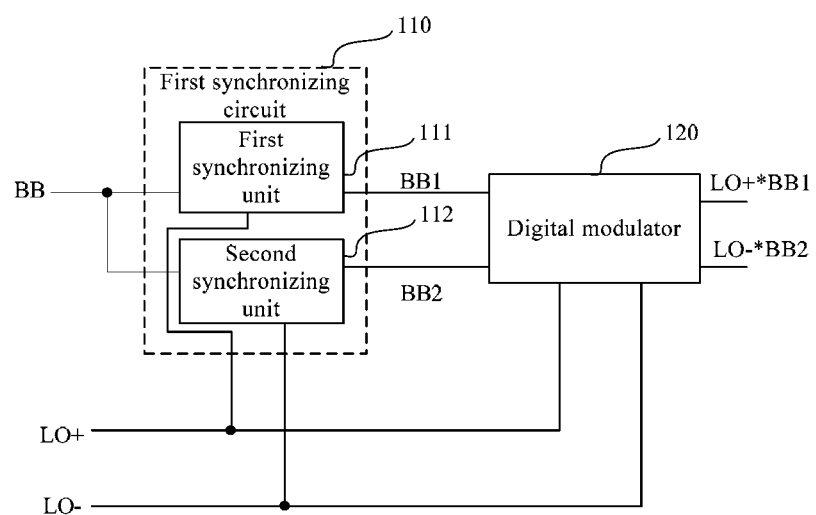
FIG. 3 is a schematic block diagram of a structure of a transmitter according to Embodiment 1 of the present invention.

The following uses FIG. 3 as an example to describe in detail a modulation circuit of a digital transmitter provided by Embodiment 1 of the present invention. FIG. 3 is a schematic structural diagram of the modulation circuit of the digital transmitter according to Embodiment 1 of the present invention. As shown in FIG. 3, the modulation circuit of the digital transmitter provided by the embodiment includes: a first synchronizing circuit 110 and a digital modulator 120.

The first synchronizing circuit 110 includes a first synchronizing unit 111 and a second synchronizing unit 112. A first input end of the first synchronizing unit 111 is configured to receive a digital baseband signal BB, a second input end of the first synchronizing unit 111 is configured to receive a first local-frequency signal LO+, and an output end of the first synchronizing unit 111 is connected to a first input end of the digital modulator 120. A first input end of the second synchronizing unit 112 is configured to receive the digital baseband signal BB, a second input end of the second synchronizing unit 112 is configured to receive a second local-frequency signal LO−, and an output end of the second synchronizing unit 112 is connected to a second input end of the digital modulator 120.

A third input end of the digital modulator 120 is configured to receive the first local-frequency signal LO+, and a fourth input end of the digital modulator 120 is configured to receive the second local-frequency signal LO−.

The first local-frequency signal LO+ and the second local-frequency signal LO− are differential signals.

Specifically, the first synchronizing unit 111 is configured to separately receive the digital baseband signal BB and the first local-frequency signal LO+, perform phase delay on the first local-frequency signal LO+, and then adjust a phase of the digital baseband signal BB, so that a rising edge and a falling edge of a first adjusted signal BB1 generated by the first synchronizing unit 111 fall in a low level range of the first local-frequency signal LO+; and the second synchronizing unit 112 is configured to separately receive the digital baseband signal BB and the second local-frequency signal LO−, perform phase delay on the second local-frequency signal LO−, and then adjust a phase of the digital baseband signal BB, so that a rising edge and a falling edge of a second adjusted signal BB2 generated by the second synchronizing unit 112 fall in a low level range of the second local-frequency signal LO−.

The digital modulator 120 is configured to receive the first adjusted signal BB1 and the second adjusted signal BB2, modulate the first adjusted signal BB1 by using the first local-frequency signal LO+, to output a first radio-frequency signal LO+*BB1, and modulate the second adjusted signal BB2 by using the second local-frequency signal LO−, to output a second radio-frequency signal LO−*BB2.

Figure 4:
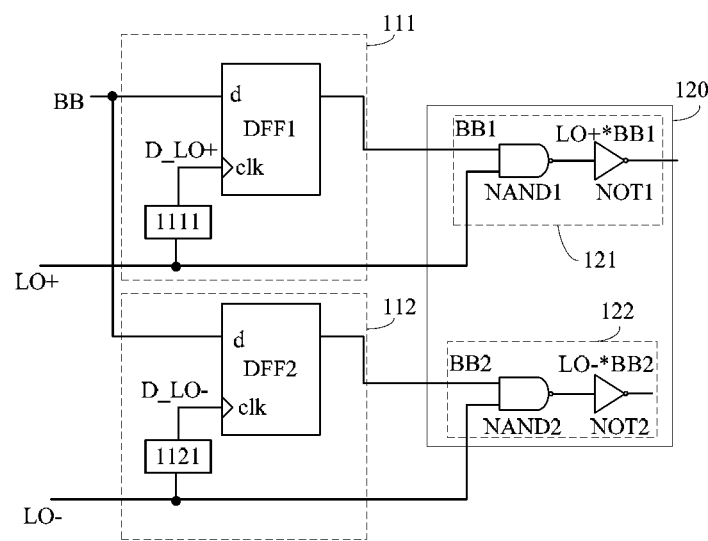
FIG. 4 is a schematic diagram of a gate-level structure of a transmitter according to Embodiment 1 of the present invention.

Further, as shown in FIG. 4, the first synchronizing unit 111 includes: a first D flip flop DFF1 and a first delay circuit 1111. The first delay circuit 1111 receives the first local-frequency signal LO+, and performs phase delay adjustment on the first local-frequency signal LO+. A d input end of the first D flip flop DFF1 receives the digital baseband signal BB, and a clock input end of the first D flip flop DFF1 receives a signal D_LO+ that is output by the first delay circuit 1111 and obtained after the delay adjustment is performed on the first local-frequency signal LO+, and triggers, according to a high level of the signal D_LO+, an output end of the first D flip flop DFF1 to output the first adjusted signal BB1.

The second synchronizing unit 112 includes: a second D flip flop DFF2 and a second delay circuit 1121. The second delay circuit 1121 is configured to receive the second local-frequency signal LO−, and perform delay adjustment on the second local-frequency signal LO−. A d input end of the second D flip flop DFF2 is configured to receive the digital baseband signal BB, and a clock input end of the second D flip flop DFF2 is configured to receive a signal D_LO− that is output by the second delay circuit 1121 and obtained after the delay adjustment is performed on the second local-frequency signal LO−, and trigger, according to a high level of the signal D_LO−, an output end of the second D flip flop DFF2 to output the second adjusted signal BB2.

The foregoing first delay circuit 1111 and second delay circuit 1121 may be specifically delayers.

The digital modulator 120 includes a first digital modulating unit 121 and a second digital modulating unit 122, where the first digital modulating unit 121 is configured to receive the first local-frequency signal LO+ and the first adjusted signal BB1, perform a logical AND operation on the first local-frequency signal LO+ and the first adjusted signal BB1, and then output the first radio-frequency signal LO+*BB1; and the second digital modulating unit 122 is configured to receive the second local-frequency signal LO− and the second adjusted signal BB2, perform a logical AND operation on the second local-frequency signal LO− and the second adjusted signal BB2, and then output the second radio-frequency signal LO−*BB2.

The first digital modulating unit 121 and the second digital modulating unit 122 may implement the logical AND operation in various specific manners. For example, the logical AND operations may be implemented separately by using an AND gate, or may be implemented by using a NAND gate and a phase inverter unit, where the phase inverter unit is equivalent to a NOT gate in a digital circuit, and may be one phase inverter or a phase inverter chain including multiple phase inverters, or may be implemented by combining basic logic gates such as a NOR gate and an exclusive-OR gate. In the embodiment, the first digital modulating unit 121 and the second digital modulating unit 122 is separately described in detail by using an implementation manner of a NAND gate and one phase inverter as an example.

The first digital modulating unit 121 specifically includes a first NAND gate NAND1 and a first phase inverter NOT1, and the second digital modulating unit 122 specifically includes a second NAND gate NAND2 and a second phase inverter NOT2.

A first receive end of the first NAND gate NAND1 receives the first adjusted signal BB1, a second receive end of the first NAND gate NAND1 is configured to receive the first local-frequency signal LO+, and an output end of the first NAND gate NAND1 is connected to an input end of the first phase inverter NOT1. The first NAND gate NAND1 performs a NAND operation on the first local-frequency signal LO+ and the first adjusted signal BB1 that are input. The first phase inverter NOT1 is configured to perform an inverting operation on a NAND operation result of the first local-frequency signal LO+ and the first adjusted signal BB1, to output the first radio-frequency signal LO+*BB1, so as to suppress phase noise of the first adjusted signal BB1 by using a low level of the first local-frequency signal LO+.

A first receive end of the second NAND gate NAND2 is configured to receive the second adjusted signal BB2, a second receive end of the second NAND gate NAND2 is configured to receive the second local-frequency signal LO−, and an output end of the second NAND gate NAND2 is connected to an input end of the second phase inverter NOT2. The second NAND gate NAND2 performs a NAND operation on the second local-frequency signal LO− and the second adjusted signal BB2 that are input. The second phase inverter NOT2 is configured to perform an inverting operation on a NAND operation result of the second local-frequency signal LO− and the second adjusted signal BB2, and then output the second radio-frequency signal LO−*BB2, so as to suppress phase noise of the second adjusted signal BB2 by using a low level of the second local-frequency signal LO−.

A control clock signal of the first D flip flop DFF1 of the first synchronizing unit 111 is D_LO+ that is obtained after the delay circuit 1111 delays the first local-frequency signal LO+. Therefore, a phase of the first adjusted signal BB1 may be flexibly controlled. A working principle of the second synchronizing unit 112 is the same as that of the first synchronizing unit 111. Therefore, a phase of the second adjusted signal BB2 may also be flexibly controlled. The digital modulator 120 is implemented by connecting a NAND logic gate and a phase inverter, where a quantity of phase inverters is determined according to a post-stage driving capability. In this way, logical expressions of the first radio-frequency signal LO+*BB1 and the second radio-frequency signal LO−*BB2 may be expressed as follows:

$$LO+*BB1=(LO+)\cap BB1 \quad \text{(Formula 1)}$$

$$LO-*BB2=(LO-)\cap BB2 \quad \text{(Formula 2)}$$

Figure 5:
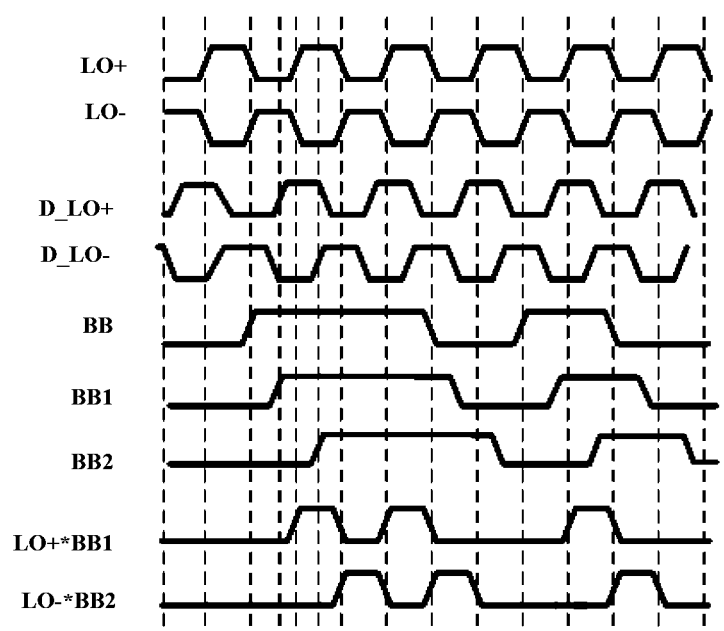
FIG. 5 is a waveform schematic diagram of input and output signals of a transmitter according to Embodiment 1 of the present invention.

FIG. 5 shows a waveform diagram of the signals in FIG. 4 corresponding to different time points. It may be seen from FIG. 5 that, after the digital baseband signal BB is adjusted by the synchronizing unit 110, the first adjusted signal BB1 and the second adjusted signal BB2 are output, the first adjusted signal BB1 and the second adjusted signal BB2 only differ from the initial digital baseband signal BB in phase delays, both the rising edge and the falling edge of the first adjusted signal BB1 fall in the low level range of the first local-frequency signal LO+, and both the rising edge and the falling edge of the second adjusted signal BB2 fall in the low level range of the second local-frequency signal LO−. Then, the first adjusted signal BB1 and the second adjusted signal BB2 are separately modulated in the digital modulator 120 by using the differential signals first local-frequency signal LO+ and second local-frequency signal LO−, so as to obtain the first radio-frequency signal LO+*BB1 and the second radio-frequency signal LO−*BB2 that do not generate a high-frequency harmonic component.

For a local-frequency signal with a duty cycle of 50%, a period in which the first local-frequency signal LO+ and the second local-frequency signal LO− are in a low level range is half a signal cycle. Compared with a conventional synchronization processing manner of edge-edge alignment, the digital synchronizing circuit of an edge-level alignment manner provided in the embodiment greatly reduces a time sequence requirement for an input signal. For example, for a local-frequency signal of 2 GHz, a period of half a cycle is 250 ps, edges of the first adjusted signal BB1 and the second adjusted signal BB2 that are output by the synchronizing circuit may jitter within a range of 250 ps without affecting finally output waveforms. Therefore, phase noise that comes from a digital baseband signal may be suppressed as long as it is ensured that the edges of the first adjusted signal BB1 fall in the low level range of the first local-frequency signal LO+, and that the edges of the second adjusted signal BB2 fall in the low level range of the second local-frequency signal LO−. In an existing submicro CMOS (Complementary Metal-Oxide-Semiconductor, complementary metal-oxide-semiconductor) technique, even if a delay of the D flip flop, technique uncertainty, a temperature effect, and the like are considered, the foregoing time sequence requirement may still be achieved easily, and the delay circuit may be used to flexibly control the phase delay on the digital baseband signal BB.

In the modulation circuit of a digital transmitter provided by Embodiment 1 of the present invention, a phase of a digital baseband signal BB is adjusted by using a first local-frequency signal LO+ and a second local-frequency signal LO−, to separately obtain a first adjusted signal BB+ with signal edges falling in a low level range of the first local-frequency signal LO+ and a second adjusted signal BB− with signal edges falling in a low level range of the second local-frequency signal LO−. Then, the first adjusted signal BB+ is modulated by using the first local-frequency signal LO+ and the second adjusted signal BB− is modulated by using the second local-frequency signal LO−, to obtain a first radio-frequency signal LO+*BB1 and a second radio-frequency signal LO−*BB2. The modulation circuit of a digital transmitter provided by the present invention can prevent a modulated radio-frequency signal from generating an unnecessary high-frequency harmonic component, and can effectively suppress phase noise that comes from a digital baseband signal.

Figure 6:
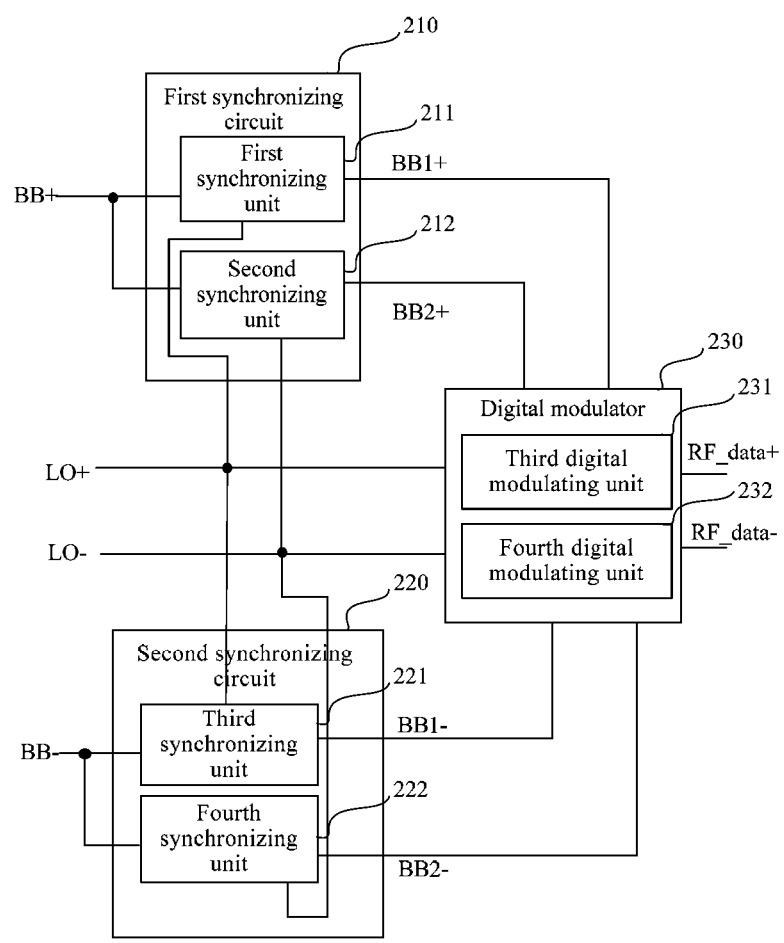
FIG. 6 is a schematic block diagram of a structure of another transmitter according to Embodiment 2 of the present invention.

The following uses FIG. 6 as an example to describe in detail another modulation circuit of a digital transmitter provided by Embodiment 2 of the present invention. FIG. 6 is a schematic structural diagram of the modulation circuit of the digital transmitter supporting differential input according to Embodiment 2 of the present invention. As shown in FIG. 6, the modulation circuit of the digital transmitter supporting differential input includes: a first synchronizing circuit 210, a second synchronizing circuit 220, and a digital modulator 230.

The first synchronizing circuit 210 includes: a first synchronizing unit 211 and a second synchronizing unit 212. A first input end of the first synchronizing unit 211 receives a first digital baseband signal BB+, a second input end of the first synchronizing unit 211 receives a first local-frequency signal LO+, and an output end of the first synchronizing unit 211 is connected to a first input end of the digital modulator 230. A first input end of the second synchronizing unit 212 receives the first digital baseband signal BB+, a second input end of the second synchronizing unit 212 receives a second local-frequency signal LO−, and an output end of the second synchronizing unit 212 is connected to a second input end of the digital modulator 230.

The second synchronizing circuit 220 includes: a third synchronizing unit 221 and a fourth synchronizing unit 222. A first input end of the third synchronizing unit 221 receives a second digital baseband signal BB−, a second input end of the third synchronizing unit 221 receives the first local-frequency signal LO+, and an output end of the third synchronizing unit 221 is connected to a third input end of the digital modulator 230. A first input end of the fourth synchronizing unit 222 receives the second digital baseband signal BB−, a second input end of the fourth synchronizing unit 222 receives the second local-frequency signal LO−, and an output end of the fourth synchronizing unit 222 is connected to a fourth input end of the digital modulator 230.

The first digital baseband signal BB+ and the second digital baseband signal BB− are differential signals, and the first local-frequency signal LO+ and the second local-frequency signal LO− are differential signals.

Specifically, the first synchronizing unit 211 receives the first digital baseband signal BB+ and the first local-frequency signal LO+, performs phase delay adjustment on the first local-frequency signal LO+, and then adjusts a phase of the first digital baseband signal BB+, so that both edges (a rising edge and a falling edge) of a first adjusted signal BB1+ output by the first synchronizing unit 211 fall in a low level range of the first local-frequency signal LO+.

The second synchronizing unit 212 receives the first digital baseband signal BB+ and the second local-frequency signal LO−, performs phase delay adjustment on the second local-frequency signal LO−, and then adjusts a phase of the first digital baseband signal BB+, so that both edges (a rising edge and a falling edge) of a second adjusted signal BB2+ output by the second synchronizing unit 212 fall in a low level range of the second local-frequency signal LO−.

The third synchronizing unit 221 receives the second digital baseband signal BB− and the first local-frequency signal LO+, performs phase delay adjustment on the first local-frequency signal LO+, and then adjusts a phase of the second digital baseband signal BB−, so that both edges of a third adjusted signal BB1− output by the third synchronizing unit 221 fall in the low level range of the first local-frequency signal LO+.

The fourth synchronizing unit 222 receives the second digital baseband signal BB− and the second local-frequency signal LO−, performs phase delay adjustment on the second local-frequency signal LO−, and then adjusts a phase of the second digital baseband signal BB−, so that both edges of a fourth adjusted signal BB2− output by the fourth synchronizing unit 222 fall in the low level range of the second local-frequency signal LO−.

The digital modulator 230 includes a third digital modulating unit 231 and a fourth digital modulating unit 232. The third digital modulating unit 231 processes the first adjusted signal BB1+, the first local-frequency signal LO+, the fourth adjusted signal BB2−, and the second local-frequency signal LO− that are input, to generate a first radio-frequency output signal RF_data+, and the fourth digital modulating unit 232 processes the second adjusted signal BB2+, the second local-frequency signal LO−, the third adjusted signal BB1−, and the first local-frequency signal LO+ that are input, to generate a second radio-frequency output signal RF_data−. A specific processing process is described in detail later.

Figure 7:
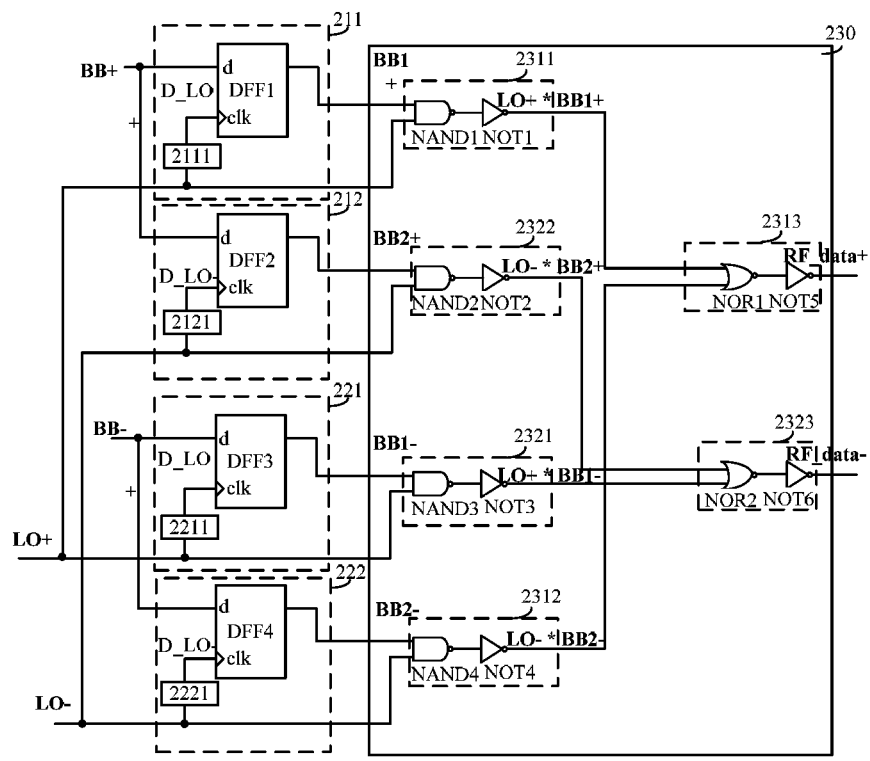
FIG. 7 is a schematic diagram of a gate-level structure of another transmitter according to Embodiment 2 of the present invention.

Further, as shown in FIG. 7, the first synchronizing unit 211 includes: a first D flip flop DFF1 and a first delay circuit 2111. The first delay circuit 2111 receives the first local-frequency signal LO+, and performs phase delay adjustment on the first local-frequency signal LO+. A d input end of the first D flip flop DFF1 receives the first digital baseband signal BB+, a clock input end of the first D flip flop DFF1 receives a signal D_LO+ that is output by the first delay circuit 2111 and obtained after the delay adjustment is performed on the first local-frequency signal LO+, and an output end of the first D flip flop DFF1 outputs the first adjusted signal BB1+.

The second synchronizing unit 212 includes: a second D flip flop DFF2 and a second delay circuit 2121. The second delay circuit 2121 receives the second local-frequency signal LO−, and performs phase delay adjustment on the second local-frequency signal LO−. A d input end of the second D flip flop DFF2 receives the first digital baseband signal BB+, a clock input end of the second D flip flop DFF2 receives a signal D_LO− that is output by the second delay circuit 2121 and obtained after the delay adjustment is performed on the second local-frequency signal LO−, and an output end of the second D flip flop DFF2 outputs the second adjusted signal BB2+.

The third synchronizing unit 221 includes: a third D flip flop DFF3 and a third delay circuit 2211. The third delay circuit 2211 receives the first local-frequency signal LO+, and performs phase delay adjustment on the first local-frequency signal LO+. A d input end of the third D flip flop DFF3 receives the second digital baseband signal BB−, a clock input end of the third D flip flop DFF3 receives a signal D_LO+ that is output by the third delay circuit 2211 and obtained after the delay adjustment is performed on the first local-frequency signal LO+, and an output end of the third D flip flop DFF3 outputs the third adjusted signal BB1−.

The fourth synchronizing unit 222 includes: a fourth D flip flop DFF4 and a fourth delay circuit 2221. The fourth delay circuit 2221 receives the second local-frequency signal LO−, and performs phase delay adjustment on the second local-frequency signal LO−. A d input end of the fourth D flip flop DFF4 receives the second digital baseband signal BB−, a clock input end of the fourth D flip flop DFF4 is configured to receive a signal D_LO− that is output by the fourth delay circuit 2221 and obtained after the delay adjustment is performed on the second local-frequency signal LO−, and an output end of the fourth D flip flop DFF4 outputs the fourth adjusted signal BB2−.

In the embodiment, the third digital modulating unit includes a first AND logic unit 2311, a second AND logic unit 2312, and a first OR logic unit 2313. The first AND logic unit 2311 is configured to perform a logical AND operation on the first local-frequency signal LO+ and the first adjusted signal BB1+ that are input, to generate a first radio-frequency signal LO+*BB1+; the second AND logic unit 2312 is configured to perform a logical AND operation on the second local-frequency signal LO− and the fourth adjusted signal BB2− that are input, to generate a fourth radio-frequency signal LO−*BB2−; and the first OR logic unit 2313 is configured to perform a logical OR operation on the first radio-frequency signal LO+*BB1+ and the fourth radio-frequency signal LO−*BB2−, to output the first radio-frequency output signal RF_data+. The fourth digital modulating unit includes a third AND logic unit 2321, a fourth AND logic unit 2322, and a second OR logic unit 2323. The third AND logic unit 2321 is configured to perform a logical AND operation on the first local-frequency signal LO+ and the third adjusted signal BB1− that are input, to generate a second radio-frequency signal LO+*BB1−; the fourth AND logic unit 2322 is configured to perform a logical AND operation on the second local-frequency signal LO− and the second adjusted signal BB2+ that are input, to generate a third radio-frequency signal LO−*BB2+; and the second OR logic unit 2323 is configured to perform a logical OR operation on the second radio-frequency signal LO+*BB1− and the third radio-frequency signal LO−*BB2+, to output the second radio-frequency output signal RF_data−.

The foregoing AND logic units 2311, 2312, 2321, and 2322 may be implemented in various specific manners, may be separately implemented by using an AND gate, or may be implemented by using a NAND gate and a phase inverter unit, and the like, where the phase inverter unit is equivalent to a NOT gate in a digital circuit, and may be one phase inverter or a phase inverter chain including multiple phase inverters, or may be implemented by combining basic logic gates such as a NOR gate and an exclusive-OR gate. In the embodiment, the foregoing AND logic units 2311, 2312, 2321, and 2322 are separately described in detail by using an implementation manner of a NAND gate and one phase inverter as an example.

The foregoing first OR logic unit 2313 or second OR logic unit 2323 may also be implemented by using an OR gate, or may be implemented by using a NOR gate and a phase inverter unit, and the like, where the phase inverter unit is equivalent to a NOT gate in a digital circuit, and may be one phase inverter or a phase inverter chain including multiple phase inverters, or may be implemented by combining basic logic gates such as a NOR gate and an exclusive-OR gate. In the embodiment, the first OR logic unit 2313 and the second OR logic unit 2323 are separately described in detail by using an implementation manner of a NOR gate and one phase inverter as an example.

The first AND logic unit 2311 includes a first NAND gate NAND1 and a first phase inverter NOT1, the second AND logic unit 2312 includes a second NAND gate NAND4 and a second phase inverter NOT4 the third AND logic unit 2321 includes a third NAND gate NAND3 and a third phase inverter NOT3, the fourth AND logic unit 2322 includes a fourth NAND gate NAND2 and a fourth phase inverter NOT2 the first OR logic unit 2313 includes a first NOR gate NOR1 and a fifth phase inverter NOT5, and the second OR logic unit 2323 includes a second NOR gate NOR2 and a sixth phase inverter NOT6. A first receive end of the first NAND gate NAND1 receives the first adjusted signal BB1+, a second receive end of the first NAND gate NAND1 receives the first local-frequency signal LO+, an output end of the first NAND gate NAND1 is connected to an input end of the first phase inverter NOT1, and an output end of the first phase inverter NOT1 outputs the first radio-frequency signal LO+*BB1+, and is connected to a first input end of the first NOR gate NOR1. A first receive end of the second NAND gate NAND4 receives the second adjusted signal BB2+, a second receive end of the second NAND gate NAND4 receives the second local-frequency signal LO−, an output end of the second NAND gate NAND4 is connected to an input end of the second phase inverter NOT4, and an output end of the second phase inverter NOT4 outputs the second radio-frequency signal LO−*BB2+, and is connected to a first input end of the second NOR gate NOR2. A first receive end of the third NAND gate NAND3 receives the third adjusted signal BB1−, a second receive end of the third NAND gate NAND3 receives the first local-frequency signal LO+, an output end of the third NAND gate NAND3 is connected to an input end of the third phase inverter NOT3, and an output end of the third phase inverter NOT3 outputs the third radio-frequency signal LO+*BB1−, and is connected to a second input end of the second NOR gate NOR2. A first receive end of the fourth NAND gate NAND2 receives the fourth adjusted signal BB2−, a second receive end of the fourth NAND gate NAND2 receives the second local-frequency signal LO−, an output end of the fourth NAND gate NAND2 is connected to an input end of the fourth phase inverter NOT2, and an output end of the fourth phase inverter NOT2 outputs the fourth radio-frequency signal LO−*BB2−, and is connected to a second input end of the first NOR gate NOR1. An output end of the first NOR gate NOR1 is connected to an input end of the fifth phase inverter NOT5, and an output end of the fifth phase inverter NOT5 outputs the first radio-frequency output signal RF_data+. An output end of the second NOR gate NOR2 is connected to an input end of the sixth phase inverter NOT6, and an output end of the sixth phase inverter NOT6 outputs the second radio-frequency output signal RF_data−.

After phase adjustment is performed separately by using two synchronizing circuits 210 and 220 on the differential digital baseband signals (that is, the first digital baseband signal BB+ and the second digital baseband signal BB−), each signal is divided into two digital baseband signals with different phase delays, that is, the first adjusted signal BB1+ and the second adjusted signal BB2+, and the third adjusted signal BB1− and the fourth adjusted signal BB2−. Then, the digital modulator 230 separately modulates the first adjusted signal BB1+, the second adjusted signal BB2+, the third adjusted signal BB1−, and the fourth adjusted signal BB2− by using the differential local-frequency signals (that is, the first local-frequency signal LO+ or the second local-frequency signal LO−), and finally generates the differential radio-frequency output signals (that is, the first radio-frequency output signal RF_data+ and the second radio-frequency output signal RF_data−). Different from the single-ended input transmitter in the previous embodiment, the transmitter supporting differential input in this embodiment implements processing of the differential signals by using connections of NAND gates, NOR gates and phase inverters. Logical expressions of the differential radio-frequency output signals (that is, the first radio-frequency output signal RF_data+ and the second radio-frequency output signal RF_data−) are separately as follows:

$(RF\_data+)=((LO+)\cap(BB1+))\cup((LO-)\cap(BB2-))$ (Formula 3)

$(RF\_data-)=((LO-)\cap(BB2+))\cup((LO+)\cap(BB1-))$ (Formula 4)

Figure 8:
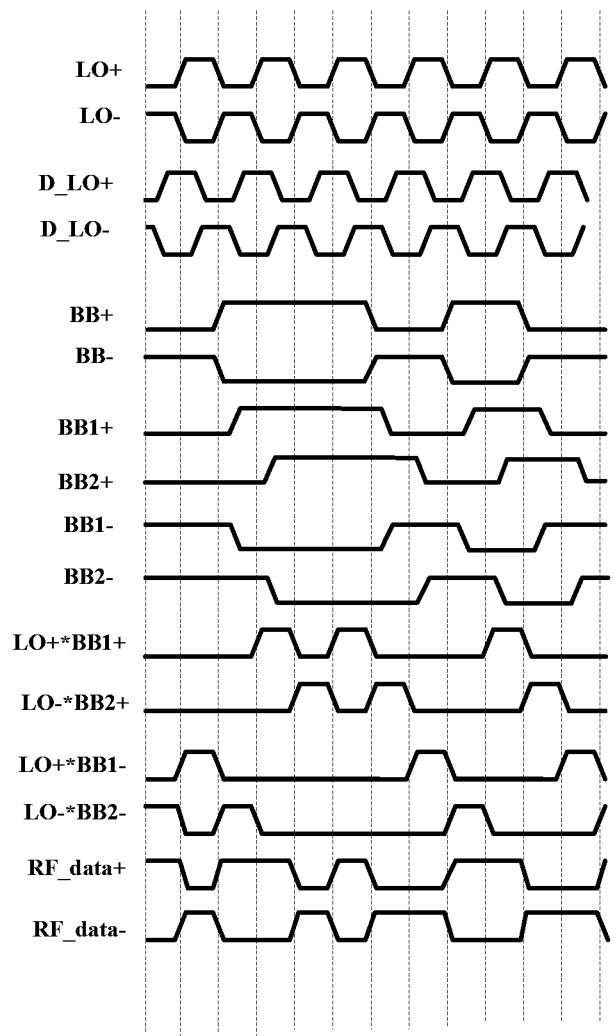
FIG. 8 is a waveform schematic diagram of input and output signals of a transmitter according to Embodiment 2 of the present invention.

FIG. 8 shows a waveform diagram of the signals in FIG. 7 corresponding to different time points. It may be seen with reference to FIG. 8 that, after the first digital baseband signal BB+ is adjusted by the first synchronizing circuit 210, the first adjusted signal BB1+ and the second adjusted signal BB2+ are output. The first adjusted signal BB1+ and the second adjusted signal BB2+ only differ from the first digital baseband signal BB+ in phase delays, and the edges of the first adjusted signal BB1+ fall in the low level range of the first local-frequency signal LO+, and the edges of the second adjusted signal BB2+ fall in the low level range of the second local-frequency signal LO−. Similarly, after the second digital baseband signal BB− is adjusted by the second synchronizing circuit 220, the third adjusted signal BB1− and the fourth adjusted signal BB2− are output. The third adjusted signal BB1− and the fourth adjusted signal BB2− only differ from the second digital baseband signal BB− in phase delays, the edges of the third adjusted signal BB1− fall in the low level range of the first local-frequency signal LO+, and the edges of the fourth adjusted signal BB2− fall in the low level range of the second local-frequency signal LO−. Then, the first adjusted signal BB1+, the second adjusted signal BB2+, the third adjusted signal BB1−, and the fourth adjusted signal BB2− are separately modulated in the digital modulator 230 by using the differential local-frequency signals LO (that is, the first local-frequency signal LO+ or the second local-frequency signal LO−), and after a logical OR operation is performed on every two signals that are output through modulation, the differential radio-frequency output signals (that is, the first radio-frequency output signal RF_data+ and the second radio-frequency output signal RF_data−) that suppress a high-frequency harmonic component are obtained.

For a local-frequency signal with a duty cycle of 50%, a period in which the first local-frequency signal LO+ and the second local-frequency signal LO− are in a low level range is half a signal cycle. Compared with a conventional synchronization processing manner of edge-edge alignment, the digital synchronizing circuit of an edge-level alignment manner provided in the embodiment greatly reduces a time sequence requirement for an input signal. For example, for a local-frequency signal of 2 GHz, a period of half a cycle is 250 ps, edges of the first adjusted signal BB1+ and the second adjusted signal BB2+ that are output by the first synchronizing circuit 210 and the third adjusted signal BB1− and the fourth adjusted signal BB2− that are output by the second synchronizing circuit 220 may jitter within a range of 250 ps without affecting finally output waveforms. Therefore, phase noise that comes from a digital baseband signal may be suppressed as long as it is ensured that edges of each modulated signal fall in a low level range of a corresponding local-frequency signal. In an existing submicro CMOS technique, even if a delay of the D flip flop, technique uncertainty, a temperature effect, and the like are considered, the foregoing time sequence requirement may still be achieved easily, and the delay circuit may be used to flexibly control the phase delay on the digital baseband signal.

In the modulation circuit of a digital transmitter provided by Embodiment 2 of the present invention, phases of differentially input digital baseband signals (that is, a first digital baseband signal BB+ and a second digital baseband signal BB−) are adjusted by using a first local-frequency signal LO+ and a second local-frequency signal LO−, to separately obtain a first adjusted signal BB1+ with signal edges falling in a low level range of the first local-frequency signal LO+, a second adjusted signal BB2+ with signal edges falling in a low level range of the second local-frequency signal LO−, a third adjusted signal BB1− with signal edges falling in the low level range of the first local-frequency signal LO+, and a fourth adjusted signal BB2− with signal edges falling in the low level range of the second local-frequency signal LO−. Then, the first adjusted signal BB1+ is modulated by using the first local-frequency signal LO+, the fourth adjusted signal BB2− is modulated by using the second local-frequency signal LO−, the second adjusted signal BB2+ is modulated by using the second local-frequency signal LO−, and the third adjusted signal BB1− is modulated by using the first local-frequency signal LO+ separately, and a logical OR operation is performed on every two radio-frequency signals that are output after modulation, to obtain differential radio-frequency output signals (a first radio-frequency output signal RF_data+ and a second radio-frequency output signal RF_data−). The modulation circuit of a digital transmitter provided by the present invention can prevent a modulated radio-frequency signal from generating an unnecessary high-frequency harmonic component, and can effectively suppress phase noise that comes from a digital baseband signal.

Figure 9:
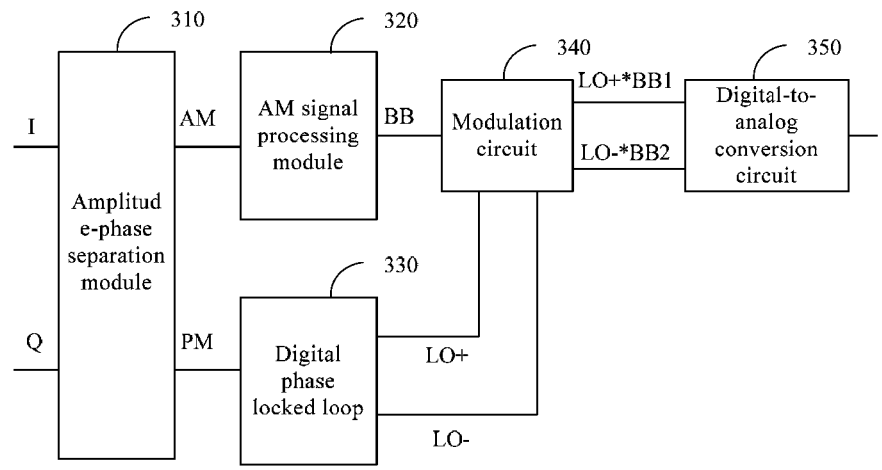
FIG. 9 is a schematic structural diagram of a digital transmitter system according to Embodiment 3 of the present invention.

The following uses FIG. 9 as an example to describe in detail a digital transmitter provided by Embodiment 3 of the present invention. FIG. 9 is a schematic structural diagram of the digital transmitter according to Embodiment 3 of the present invention.

As shown in FIG. 9, the digital transmitter includes: an amplitude-phase separation module 310, an AM (amplitude modulation) signal processing module 320, a digital phase locked loop 330, a modulation circuit 340, and a digital-to-analog conversion circuit 350.

The modulation circuit 340 is the modulation circuit provided in Embodiment 1 of the present invention.

The amplitude-phase separation module 310 performs amplitude-phase separation on a digital baseband quadrature signal IQ (in-phase-quadrature signal), where an amplitude modulation signal AM enters the AM signal processing module 320 for processing such as digital interpolation, upsampling and digital filtering, and then is converted into a high-rate single-ended digital baseband signal BB, and after being modulated by the digital phase locked loop 330, a phase modulation signal PM is output in a manner of differential local-frequency signals LO+ and LO−. The single-ended digital baseband signal BB and the differential local-frequency signals LO+ and LO− are processed by the modulation circuit 340, and then radio-frequency signals LO+*BB1 and LO−*BB2 are generated. The digital-to-analog conversion circuit 350 receives the radio-frequency signals LO+*BB1 and LO−*BB2, and converts the radio-frequency signals LO+*BB1 and LO−*BB2 into an analog signal for output.

It should be noted that the foregoing digital-to-analog conversion circuit 350 may be specifically a digital power amplifier or a radio-frequency digital-to-analog converter.

By using the digital transmitter provided by the embodiment of the present invention, a high-frequency harmonic component caused by a phase problem of a digital baseband signal and a local-frequency signal can be effectively avoided, and noise of the digital baseband signal is suppressed, so that both a capability of suppressing a high-order harmonic wave and a capability of suppressing out-of-band noise of a digital modulator system are improved.

Figure 10:
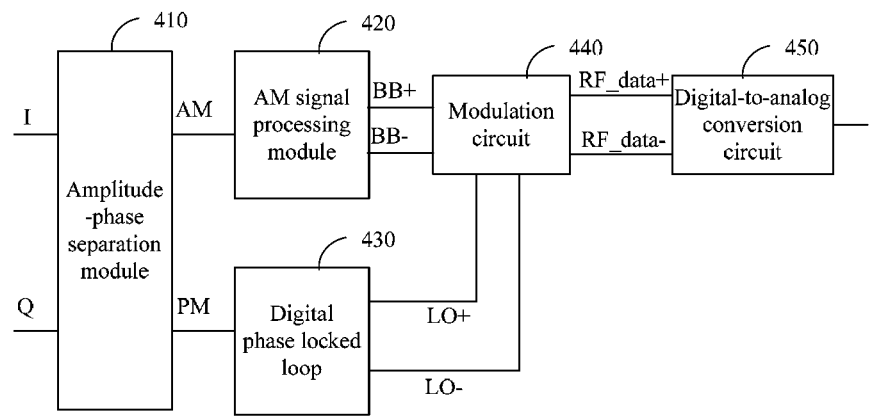
FIG. 10 is a schematic structural diagram of another digital transmitter system according to Embodiment 4 of the present invention.

The following uses FIG. 10 as an example to describe in detail another digital transmitter system provided by Embodiment 4 of the present invention. FIG. 10 is a schematic structural diagram of the another digital transmitter system according to Embodiment 4 of the present invention.

As shown in FIG. 10, the digital transmitter includes: an amplitude-phase separation module 410, an AM signal processing module 420, a digital phase locked loop 430, a modulation circuit 440, and a digital-to-analog conversion circuit 450.

The modulation circuit 440 is the modulation circuit provided in Embodiment 2 of the present invention.

The amplitude-phase separation module 410 performs amplitude-phase separation on a digital baseband quadrature signal IQ, where an amplitude modulation signal AM enters the AM signal processing module 420 for processing such as digital interpolation, upsampling and digital filtering, and then is converted into high-rate differential digital baseband signals BB+ and BB−, and after being modulated by the digital phase locked loop 430, a phase modulation signal PM is output in a manner of differential local-frequency signals LO+ and LO−. The differential digital baseband signals BB+ and BB− and the differential local-frequency signals LO+ and LO− are processed by the modulation circuit 440, and then radio-frequency signals RF_data+ and RF_data− are generated. The digital-to-analog conversion circuit 450 receives the radio-frequency signal RF_data+ and RF_data−, and converts the radio-frequency signals RF_data+ and RF_data− into an analog signal for output.

It should be noted that the foregoing digital-to-analog conversion circuit 450 may be specifically a digital power amplifier or a radio-frequency digital-to-analog converter.

By using the digital transmitter provided by the embodiment of the present invention, a high-frequency harmonic component caused by a phase problem of a digital baseband signal and a local-frequency signal can be effectively avoided, and noise of the digital baseband signal is suppressed, so that both a capability of suppressing a high-order harmonic wave and a capability of suppressing out-of-band noise of a digital modulator system are improved.

Figure 11:
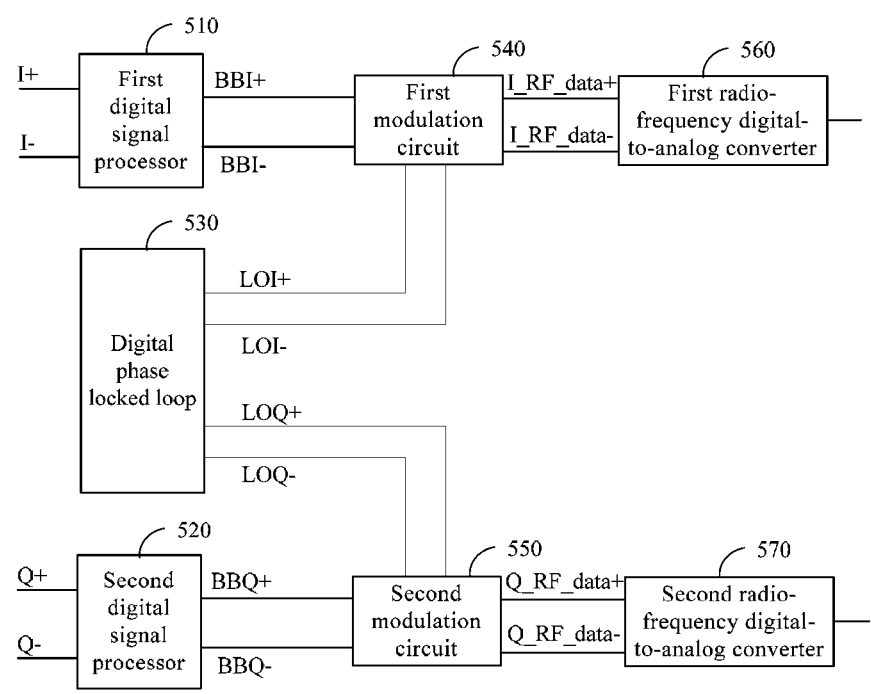
FIG. 11 is a schematic structural diagram of still another digital transmitter system according to Embodiment 5 of the present invention.

The following uses FIG. 11 as an example to describe in detail still another digital transmitter provided by Embodiment 5 of the present invention. FIG. 11 is a schematic structural diagram of the still another digital transmitter according to Embodiment 5 of the present invention.

As shown in FIG. 11, the digital transmitter includes: a first digital signal processor 510, a second digital signal processor 520, a digital phase locked loop 530, a first modulation circuit 540, a second modulation circuit 550, a first radio-frequency digital-to-analog converter 560, and a second radio-frequency digital-to-analog converter 570.

Each of the first modulation circuit 540 and the second modulation circuit 550 is the modulation circuit provided in Embodiment 2 of the present invention.

The first digital signal processor 510 is configured to receive first input signals I+ and I− that are differentially input, and generate a first digital baseband signal BBI+ and a second digital baseband signal BBI−.

The second digital signal processor 520 is configured to receive second input signals Q+ and Q− that are differentially input, and generate a third digital baseband signal BBQ+ and a fourth digital baseband signal BBQ−, where the first input signals and the second input signals are in-phase and quadrature signals.

The digital phase locked loop 530 is configured to generate a first group of local-frequency signals and a second group of local-frequency signals, where the first group of local-frequency signals is orthogonal to the second group of local-frequency signals, the first group of local-frequency signals includes a first local-frequency signal LOI+ and a second local-frequency signal LOI− that are differential to each other; and the second group of local-frequency signals includes a third local-frequency signal LOQ+ and a fourth local-frequency signal LOQ− that are differential to each other.

The first modulation circuit 540 is configured to receive the first digital baseband signal BBI+, the second digital baseband signal BBI−, the first local-frequency signal LOI+, and the second local-frequency signal LOI−; perform phase delay on the first local-frequency signal LOI+, and then perform phase adjustment on the first digital baseband signal BBI+, to generate a first adjusted signal, so that a rising edge and a falling edge of the first adjusted signal fall in a low level range of the first local-frequency signal LOI+; perform phase delay on the second local-frequency signal LOI−, and then perform phase adjustment on the first digital baseband signal BBI+, to generate a second adjusted signal, so that a rising edge and a falling edge of the second adjusted signal fall in a low level range of the second local-frequency signal LOI−; perform phase delay on the first local-frequency signal LOI+, and then perform phase adjustment on the second digital baseband signal BBI−, to generate a third adjusted signal, so that a rising edge and a rising edge of the third adjusted signal fall in the low level range of the first local-frequency signal LOI+; perform phase delay on the second local-frequency signal LOI−, and then perform phase adjustment on the second digital baseband signal BBI−, to generate a fourth adjusted signal, so that a rising edge and a falling edge of the fourth adjusted signal fall in the low level range of the second local-frequency signal LOI−; modulate the first adjusted signal by using the first local-frequency signal LOI+, to generate a first radio-frequency signal; modulate the second adjusted signal by using the second local-frequency signal LOI−, to generate a second radio-frequency signal; modulate the third adjusted signal by using the first local-frequency signal LOI+, to generate a third radio-frequency signal; modulate the fourth adjusted signal by using the second local-frequency signal LOI−, to generate a fourth radio-frequency signal; overlap the first radio-frequency signal and the fourth radio-frequency signal, to obtain a first radio-frequency output signal I_RF_data+; and overlap the second radio-frequency signal and the third radio-frequency signal, to obtain a second radio-frequency output signal I_RF_data−.

The second modulation circuit 550 is configured to receive the third digital baseband signal BBQ+, the fourth digital baseband signal BBQ−, the third local-frequency signal LOQ+, and the fourth local-frequency signal LOQ−; perform phase delay on the third local-frequency signal LOQ+, and then perform phase adjustment on the third digital baseband signal BBQ+, to generate a fifth adjusted signal, so that a rising edge and a falling edge of the fifth adjusted signal fall in a low level range of the third local-frequency signal LOQ+; perform phase delay on the fourth local-frequency signal LOQ−, and then perform phase adjustment on the third digital baseband signal BBQ+, to generate a sixth adjusted signal, so that a rising edge and a falling edge of the sixth adjusted signal fall in a low level range of the fourth local-frequency signal LOQ−; perform phase delay on the third local-frequency signal LOQ+, and then perform phase adjustment on the fourth digital baseband signal BBQ−, to generate a seventh adjusted signal, so that a rising edge and a falling edge of the seventh adjusted signal fall in the low level range of the third local-frequency signal LOQ+; perform phase delay on the fourth local-frequency signal LOQ−, and then perform phase adjustment on the fourth digital baseband signal BBQ−, to generate an eighth adjusted signal, so that a rising edge and a falling edge of the eighth adjusted signal fall in the low level range of the fourth local-frequency signal LOQ−; modulate the fifth adjusted signal by using the third local-frequency signal LOQ+, to generate a fifth radio-frequency signal; modulate the sixth adjusted signal by using the fourth local-frequency signal LOQ−, to generate a sixth radio-frequency signal; modulate the seventh adjusted signal by using the third local-frequency signal LOQ+, to generate a seventh radio-frequency signal; modulate the eighth adjusted signal by using the fourth local-frequency signal LOQ−, to generate an eighth radio-frequency signal; overlap the fifth radio-frequency signal and the eighth radio-frequency signal, to obtain a third radio-frequency output signal Q_RF_data+, and overlap the sixth radio-frequency signal and the seventh radio-frequency signal, to obtain a fourth radio-frequency output signal Q_RF_data−.

The first radio-frequency digital-to-analog converter 560 converts the first radio-frequency output signal I_RF_data− and the second radio-frequency output signal I_RF_data− into a first analog signal for output.

The second radio-frequency digital-to-analog converter 570 converts the third radio-frequency output signal Q_RF_data+ and the fourth radio-frequency output signal I_RF_data− into a second analog signal for output. By using the digital transmitter provided by the embodiment of the present invention, a high-frequency harmonic component caused by a phase problem of a digital baseband signal and a local-frequency signal can be effectively avoided, and noise of the digital baseband signal is suppressed, so that both a capability of suppressing a high-order harmonic wave and a capability of suppressing out-of-band noise of a digital modulator system are improved.

Figure 12:
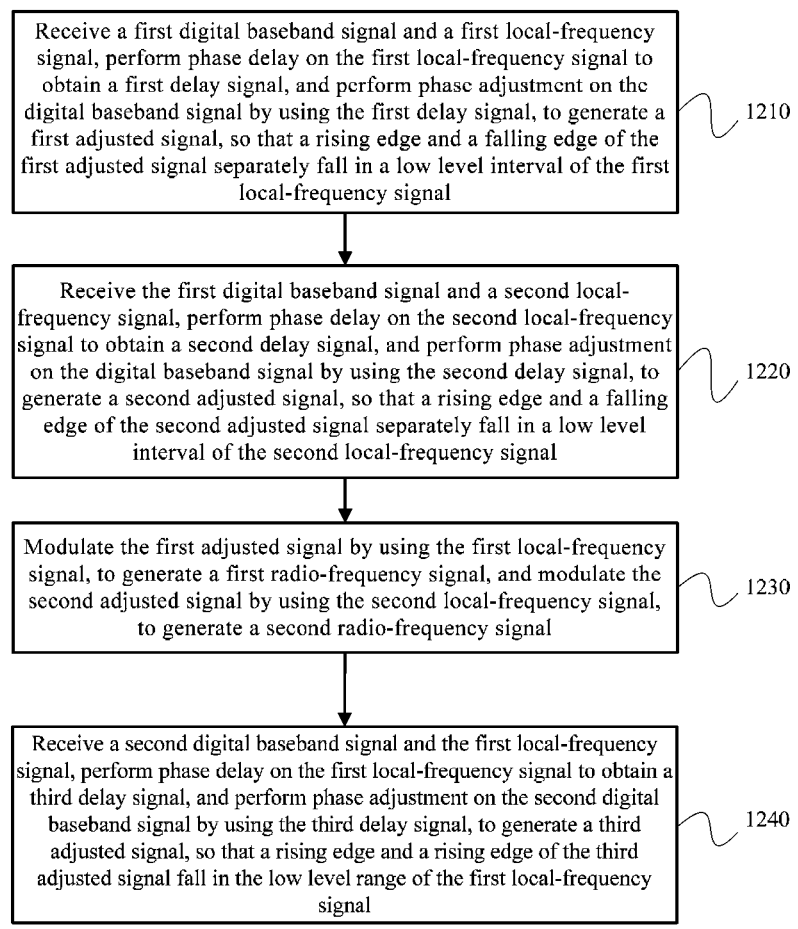
FIG. 12 is a flowchart of a signal modulation method according to an embodiment of the present invention.

Correspondingly, an embodiment of the present invention further provides a signal modulation method. As shown in FIG. 12, the method includes the following steps:

Step 1210: Receive a first digital baseband signal and a first local-frequency signal, perform phase delay on the first local-frequency signal to obtain a first delay signal, and perform phase adjustment on the first digital baseband signal by using the first delay signal, to generate a first adjusted signal, so that a rising edge and a falling edge of the first adjusted signal fall in a low level range of the first local-frequency signal.

Step 1220: Receive the first digital baseband signal and a second local-frequency signal, perform phase delay on the second local-frequency signal to obtain a second delay signal, and perform phase adjustment on the first digital baseband signal by using the second delay signal, to generate a second adjusted signal, so that a rising edge and a falling edge of the second adjusted signal fall in a low level range of the second local-frequency signal.

The first local-frequency signal and the second local-frequency signal are differential signals, and phase delays of the first delay signal and the second delay signal are the same.

Step 1230: Modulate the first adjusted signal by using the first local-frequency signal, to generate a first radio-frequency signal, and modulate the second adjusted signal by using the second local-frequency signal, to generate a second radio-frequency signal.

The foregoing step 1210 and step 1220 may be executed in the foregoing sequence, or may be executed simultaneously, or, step 1220 may be executed first and then step 1210 is executed.

Optionally, the method further includes:

Step 1240: Receive a second digital baseband signal and the first local-frequency signal, perform phase delay on the first local-frequency signal to obtain a third delay signal, and perform phase adjustment on the second digital baseband signal by using the third delay signal, to generate a third adjusted signal, so that a rising edge and a rising edge of the third adjusted signal fall in the low level range of the first local-frequency signal.

Step 1250: Receive the second digital baseband signal and the second local-frequency signal, perform phase delay on the second local-frequency signal to obtain a fourth delay signal, and perform phase adjustment on the second digital baseband signal by using the fourth delay signal, to generate a fourth adjusted signal, so that a rising edge and a falling edge of the fourth adjusted signal fall in the low level range of the second local-frequency signal.

The first digital baseband signal and the second digital baseband signal are differential signals, and phase delays of the third delay signal and the fourth delay signal are the same.

Step 1260: Modulate the third adjusted signal by using the first local-frequency signal, to generate a third radio-frequency signal, and modulate the fourth adjusted signal by using the second local-frequency signal, to generate a fourth radio-frequency signal.

The foregoing step 1240 to step 1260 may be executed in parallel with step 1210 to step 1230.

Step 1270: Overlap the first radio-frequency signal and the fourth radio-frequency signal, to obtain a first radio-frequency output signal, and overlap the second radio-frequency signal and the third radio-frequency signal, to obtain a second radio-frequency output signal.

According to the signal modulation method provided by the embodiment of the present invention, a high-frequency harmonic component caused by a phase problem of a digital baseband signal and a local-frequency signal can be effectively avoided, and noise of the digital baseband signal is suppressed, so that both a capability of suppressing a high-order harmonic wave and a capability of suppressing out-of-band noise of a digital modulator system are improved.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

In the foregoing specific implementation manners, the objective, technical solutions, and benefits of the present invention are further described in detail. It should be understood that the foregoing descriptions are merely specific implementation manners of the present invention, but are not intended to limit the protection scope of the present invention. Any modification, equivalent replacement, or improvement made without departing from the spirit and principle of the present invention should fall within the protection scope of the present invention.

What is claimed is:

1. A modulation circuit of a digital transmitter, wherein the modulation circuit comprises: a first synchronizing circuit and a digital modulator, and the first synchronizing circuit comprises: a first synchronizing unit and a second synchronizing unit, wherein the first synchronizing unit is configured to separately receive a first digital baseband signal and a first local-frequency signal, perform phase delay on the first local-frequency signal to obtain a first delay signal, and perform phase adjustment on the first digital baseband signal by using the first delay signal, to generate a first adjusted signal, so that both a rising edge and a falling edge of the first adjusted signal fall in a low level range of the first local-frequency signal, wherein the first synchronizing unit comprises: a first delayer and a first D flip flop;

the second synchronizing unit is configured to separately receive the first digital baseband signal and a second local-frequency signal, perform phase delay on the second local-frequency signal to obtain a second delay signal, and perform phase adjustment on the first digital baseband signal by using the second delay signal, to generate a second adjusted signal, so that a rising edge and a falling edge of the second adjusted signal fall in a low level range of the second local-frequency signal, wherein the first local-frequency signal and the second local-frequency signal are differential signals, and phase delays of the first delay signal and the second delay signal are the same, wherein the second synchronizing unit comprises: a second delayer and a second D flip flop; and the digital modulator is configured to separately modulate the first adjusted signal by using the first local-frequency signal, to generate a first radio-frequency signal, and modulate the second adjusted signal by using the second local-frequency signal, to generate a second radio-frequency signal; and wherein the modulation circuit further comprises: a second synchronizing circuit, and the second synchronizing circuit comprises: a third synchronizing unit and a fourth synchronizing unit, wherein the third synchronizing unit is configured to separately receive a second digital baseband signal and the first local-frequency signal, perform phase delay on the first local-frequency signal to obtain a third delay signal, and perform phase adjustment on the second digital baseband signal by using the third delay signal, to generate a third adjusted signal, so that both a rising edge and a falling edge of the third adjusted signal fall in the low level range of the first local-frequency signal, wherein the third synchronizing unit comprises: a third delayer and a third D flip flop;

the fourth synchronizing unit is configured to separately receive the second digital baseband signal and the second local-frequency signal, perform phase delay on the second local-frequency signal to obtain a fourth delay signal, and perform phase adjustment on the second digital baseband signal by using the fourth delay signal, to generate a fourth adjusted signal, so that both a rising edge and a falling edge of the fourth adjusted signal fall in the low level range of the second local-frequency signal, wherein the first digital baseband signal and the second digital baseband signal are differential signals, and phase delays of the third delay signal and the fourth delay signal are the same, wherein the fourth synchronizing unit comprises: a fourth delayer and a fourth D flip flop; and the digital modulator is further configured to separately modulate the third adjusted signal by using the first local-frequency signal, to generate a third radio-frequency signal, and modulate the fourth adjusted signal by using the second local-frequency signal, to generate a fourth radio-frequency signal; and overlap the first radio-frequency signal and the fourth radio-frequency signal, to obtain a first radio-frequency output signal, and overlap the second radio-frequency signal and the third radio-frequency signal, to obtain a second radio-frequency output signal.

2. The modulation circuit according to claim 1, wherein the first delayer is configured to perform phase delay on the first local-frequency signal to obtain the first delay signal, and input the first delay signal to the first D flip flop as a first clock signal; and the first D flip flop performs phase adjustment on the first digital baseband signal according to triggering of the first clock signal, to output the first adjusted signal; and wherein the second delayer is configured to perform phase delay on the second local-frequency signal to obtain the second delay signal, and input the second delay signal to the second D flip flop as a second clock signal; and the second D flip flop performs phase adjustment on the first digital baseband signal according to triggering of the second clock signal, to output the second adjusted signal.

3. The modulation circuit according to claim 1, wherein the digital modulator comprises a first digital modulating unit and a second digital modulating unit, wherein the first digital modulating unit is configured to receive the first local-frequency signal and the first adjusted signal, and perform a logical AND operation on the first local-frequency signal and the first adjusted signal to output the first radio-frequency signal, wherein the first digital modulating unit corresponds to a logic gate combination; and the second digital modulating unit is configured to receive the second local-frequency signal and the second adjusted signal, and perform a logical AND operation on the second local-frequency signal and the second adjusted signal to output the second radio-frequency signal, wherein the second digital modulating unit corresponds to another logic gate combination.

4. The modulation circuit according to claim 1, wherein the third delayer is configured to perform phase delay on the first local-frequency signal to obtain the third delay signal, and input the third delay signal to the third D flip flop as a third clock signal;

the third D flip flop is configured to perform phase adjustment on the second digital baseband signal according to triggering of the third clock signal, to output the third adjusted signal;

the fourth delayer is configured to perform phase delay on the second local-frequency signal to obtain the fourth delay signal, and input the fourth delay signal to the fourth D flip flop as a fourth clock signal; and the fourth D flip flop is configured to perform phase adjustment on the second digital baseband signal according to triggering of the fourth clock signal, to output the fourth adjusted signal.

5. The modulation circuit according to claim 1, wherein the digital modulator comprises a third digital modulating unit and a fourth digital modulating unit, wherein the third digital modulating unit comprises a first AND logic unit, a second AND logic unit, and a first OR logic unit, wherein the first AND logic unit is configured to perform a logical AND operation on the first local-frequency signal and the first adjusted signal, to generate the first radio-frequency signal; the second AND logic unit is configured to perform a logical AND operation on the second local-frequency signal and the fourth adjusted signal, to generate the fourth radio-frequency signal; and the first OR logic unit is configured to perform a logical OR operation on the first radio-frequency signal and the fourth radio-frequency signal, to output the first radio-frequency output signal, wherein the third digital modulating unit corresponds to a first logic gate combination;

the fourth digital modulating unit comprises a third AND logic unit, a fourth AND logic unit, and a second OR logic unit, wherein the third AND logic unit is configured to perform a logical AND operation on the first local-frequency signal and the third adjusted signal, to generate the second radio-frequency signal; the fourth AND logic unit is configured to perform a logical AND operation on the second local-frequency signal and the second adjusted signal, to generate the third radio-frequency signal; and the second OR logic unit is configured to perform a logical OR operation on the second radio-frequency signal and the third radio-frequency signal, to output the second radio-frequency output signal, wherein the fourth digital modulating unit corresponds to a second logic gate combination; and wherein any one of the AND logic units corresponds to a third logic gate combination, and any one of the OR logic units corresponds to a fourth logic gate combination.

6. The modulation circuit according to claim 2, wherein any one of the D flip flops is a D flip flop triggered by a clock signal rising edge.

7. A digital transmitter, wherein the digital transmitter comprises:

an amplitude-phase separator, configured to perform amplitude-phase separation on two input quadrature signals, to generate an amplitude modulation AM signal and a phase modulation PM signal;

an AM signal processor, configured to process the AM signal, to generate digital baseband signals, wherein the digital baseband signals comprises: a first digital baseband signal and a second digital baseband signal;

a digital phase locked loop, configured to modulate the PM signal, to generate a first local-frequency signal and a second local-frequency signal, wherein the first local-frequency signal and the second local-frequency signal are differential signals;

a modulation circuit comprising a first synchronizing circuit, a second synchronizing circuit and a digital modulator, and the first synchronizing circuit comprises: a first synchronizing unit and a second synchronizing unit, the second synchronizing circuit comprises: a third synchronizing unit and a fourth synchronizing unit, wherein the first synchronizing unit is configured to separately receive the first digital baseband signal and the first local-frequency signal, perform phase delay on the first local-frequency signal to obtain a first delay signal, and perform phase adjustment on the first digital baseband signal by using the first delay signal, to generate a first adjusted signal, so that both a rising edge and a falling edge of the first adjusted signal fall in a low level range of the first local-frequency signal, wherein the first synchronizing unit comprises: a first delayer and a first D flip flop;

the second synchronizing unit is configured to separately receive the first digital baseband signal and the second local-frequency signal, perform phase delay on the second local-frequency signal to obtain a second delay signal, and perform phase adjustment on the first digital baseband signal by using the second delay signal, to generate a second adjusted signal, so that a rising edge and a falling edge of the second adjusted signal fall in a low level range of the second local-frequency signal, wherein the first local-frequency signal and the second local-frequency signal are differential signals, and phase delays of the first delay signal and the second delay signal are the same, wherein the second synchronizing unit comprises: a second delayer and a second D flip flop;

the third synchronizing unit is configured to separately receive the second digital baseband signal and the first local-frequency signal, perform phase delay on the first local-frequency signal to obtain a third delay signal, and perform phase adjustment on the second digital baseband signal by using the third delay signal, to generate a third adjusted signal, so that both a rising edge and a falling edge of the third adjusted signal fall in the low level range of the first local-frequency signal, wherein the third synchronizing unit comprises: a third delayer and a third D flip flop;

the fourth synchronizing unit is configured to separately receive the second digital baseband signal and the second local-frequency signal, perform phase delay on the second local-frequency signal to obtain a fourth delay signal, and perform phase adjustment on the second digital baseband signal by using the fourth delay signal, to generate a fourth adjusted signal, so that both a rising edge and a falling edge of the fourth adjusted signal fall in the low level range of the second local-frequency signal, wherein the first digital baseband signal and the second digital baseband signal are differential signals, and phase delays of the third delay signal and the fourth delay signal are the same, wherein the fourth synchronizing unit comprises: a fourth delayer and a fourth D flip flop; and the digital modulator is configured to separately modulate the first adjusted signal by using the first local-frequency signal, to generate a first radio-frequency signal, and modulate the second adjusted signal by using the second local-frequency signal, to generate a second radio-frequency signal; and the digital modulator is further configured to separately modulate the third adjusted signal by using the first local-frequency signal, to generate a third radio-frequency signal, and modulate the fourth adjusted signal by using the second local-frequency signal, to generate a fourth radio-frequency signal; and overlap the first radio-frequency signal and the fourth radio-frequency signal, to obtain a first radio-frequency output signal, and overlap the second radio-frequency signal and the third radio-frequency signal, to obtain a second radio-frequency output signal; and a digital-to-analog conversion circuit, configured to receive the first radio-frequency output signal and the second radio-frequency output signal that are differentially input, and convert the first radio-frequency output signal and the second radio-frequency output signal into an analog signal for output.

8. A digital transmitter, wherein the digital transmitter comprises:

a first digital signal processor, configured to receive first input signals that are differentially input, and generate a first digital baseband signal and a second digital baseband signal;

a second digital signal processor, configured to receive second input signals that are differentially input, and generate a third digital baseband signal and a fourth digital baseband signal, wherein the first input signals and the second input signals are in-phase and quadrature signals;

a digital phase locked loop, configured to generate a first group of local-frequency signals and a second group of local-frequency signals, wherein the first group of local-frequency signals is orthogonal to the second group of local-frequency signals, the first group of local-frequency signals comprises a first local-frequency signal and a second local-frequency signal that are differential to each other; and the second group of local-frequency signals comprises a third local-frequency signal and a fourth local-frequency signal that are differential to each other;

a first modulation circuit, configured to receive the first digital baseband signal, the second digital baseband signal, the first local-frequency signal, and the second local-frequency signal; perform phase delay on the first local-frequency signal, and then perform phase adjustment on the first digital baseband signal, to generate a first adjusted signal, so that both a rising edge and a falling edge of the first adjusted signal fall in a low level range of the first local-frequency signal; perform phase delay on the second local-frequency signal, and then perform phase adjustment on the first digital baseband signal, to generate a second adjusted signal, so that both a rising edge and a falling edge of the second adjusted signal fall in a low level range of the second local-frequency signal; perform phase delay on the first local-frequency signal, and then perform phase adjustment on the second digital baseband signal, to generate a third adjusted signal, so that both a rising edge and a rising edge of the third adjusted signal fall in the low level range of the first local-frequency signal; perform phase delay on the second local-frequency signal, and then perform phase adjustment on the second digital baseband signal, to generate a fourth adjusted signal, so that both a rising edge and a falling edge of the fourth adjusted signal fall in the low level range of the second local-frequency signal; modulate the first adjusted signal by using the first local-frequency signal, to generate a first radio-frequency signal; modulate the second adjusted signal by using the second local-frequency signal, to generate a second radio-frequency signal; modulate the third adjusted signal by using the first local-frequency signal, to generate a third radio-frequency signal; modulate the fourth adjusted signal by using the second local-frequency signal, to generate a fourth radio-frequency signal; overlap the first radio-frequency signal and the fourth radio-frequency signal, to obtain a first radio-frequency output signal; and overlap the second radio-frequency signal and the third radio-frequency signal, to obtain a second radio-frequency output signal;

a second modulation circuit, configured to receive the third digital baseband signal, the fourth digital baseband signal, the third local-frequency signal, and the fourth local-frequency signal; perform phase delay on the third local-frequency signal, and then perform phase adjustment on the third digital baseband signal, to generate a fifth adjusted signal, so that both a rising edge and a falling edge of the fifth adjusted signal fall in a low level range of the third local-frequency signal; perform phase delay on the fourth local-frequency signal, and then perform phase adjustment on the third digital baseband signal, to generate a sixth adjusted signal, so that both a rising edge and a falling edge of the sixth adjusted signal fall in a low level range of the fourth local-frequency signal; perform phase delay on the third local-frequency signal, and then perform phase adjustment on the fourth digital baseband signal, to generate a seventh adjusted signal, so that both a rising edge and a falling edge of the seventh adjusted signal fall in the low level range of the third local-frequency signal; perform phase delay on the fourth local-frequency signal, and then perform phase adjustment on the fourth digital baseband signal, to generate an eighth adjusted signal, so that both a rising edge and a falling edge of the eighth adjusted signal fall in the low level range of the fourth local-frequency signal; modulate the fifth adjusted signal by using the third local-frequency signal, to generate a fifth radio-frequency signal; modulate the sixth adjusted signal by using the fourth local-frequency signal, to generate a sixth radio-frequency signal; modulate the seventh adjusted signal by using the third local-frequency signal, to generate a seventh radio-frequency signal; modulate the eighth adjusted signal by using the fourth local-frequency signal, to generate an eighth radio-frequency signal; overlap the fifth radio-frequency signal and the eighth radio-frequency signal, to obtain a third radio-frequency output signal, and overlap the sixth radio-frequency signal and the seventh radio-frequency signal, to obtain a fourth radio-frequency output signal;

a first radio-frequency digital-to-analog converter, configured to converting the first radio-frequency output signal and the second radio-frequency output signal into a first analog signal for output; and a second radio-frequency digital-to-analog converter, configured to converting the third radio-frequency output signal and the fourth radio-frequency output signal into a second analog signal for output.

9. A signal modulation method, wherein the method comprises:

receiving a first digital baseband signal and a first local-frequency signal, performing phase delay on the first local-frequency signal to obtain a first delay signal, and performing phase adjustment on the first digital baseband signal by using the first delay signal, to generate a first adjusted signal, so that both a rising edge and a falling edge of the first adjusted signal fall in a low level range of the first local-frequency signal;

receiving the first digital baseband signal and a second local-frequency signal, performing phase delay on the second local-frequency signal to obtain a second delay signal, and performing phase adjustment on the first digital baseband signal by using the second delay signal, to generate a second adjusted signal, so that both a rising edge and a falling edge of the second adjusted signal fall in a low level range of the second local-frequency signal, wherein the first local-frequency signal and the second local-frequency signal are differential signals, and phase delays of the first delay signal and the second delay signal are the same; and modulating the first adjusted signal by using the first local-frequency signal, to generate a first radio-frequency signal, and modulating the second adjusted signal by using the second local-frequency signal, to generate a second radio-frequency signal;

wherein the method further comprises:

receiving a second digital baseband signal and the first local-frequency signal, performing phase delay on the first local-frequency signal to obtain a third delay signal, and performing phase adjustment on the second digital baseband signal by using the third delay signal, to generate a third adjusted signal, so that both a rising edge and a falling edge of the third adjusted signal fall in the low level range of the first local-frequency signal;

receiving the second digital baseband signal and the second local-frequency signal, performing phase delay on the second local-frequency signal to obtain a fourth delay signal, and performing phase adjustment on the second digital baseband signal by using the fourth delay signal, to generate a fourth adjusted signal, so that both a rising edge and a falling edge of the fourth adjusted signal fall in the low level range of the second local-frequency signal, wherein the first digital baseband signal and the second digital baseband signal are differential signals, and phase delays of the third delay signal and the fourth delay signal are the same; and modulating the third adjusted signal by using the first local-frequency signal, to generate a third radio-frequency signal, and modulating the fourth adjusted signal by using the second local-frequency signal, to generate a fourth radio-frequency signal; and overlapping the first radio-frequency signal and the fourth radio-frequency signal, to obtain a first radio-frequency output signal, and overlapping the second radio-frequency signal and the third radio-frequency signal, to obtain a second radio-frequency output signal.

10. The method according to claim 9, further comprising:

performing phase delay on the first local-frequency signal to obtain the first delay signal, and inputting the first delay signal to a first D flip flop as a first clock signal; and performing phase adjustment on the first digital baseband signal according to triggering of the first clock signal, to output the first adjusted signal; and performing phase delay on the second local-frequency signal to obtain the second delay signal, and inputting the second delay signal to a second D flip flop as a second clock signal; and performing phase adjustment on the first digital baseband signal according to triggering of the second clock signal, to output the second adjusted signal.

11. The method according to claim 9, further comprising:

receiving the first local-frequency signal and the first adjusted signal, and performing a logical AND operation on the first local-frequency signal and the first adjusted signal to output the first radio-frequency signal; and receiving the second local-frequency signal and the second adjusted signal, and performing a logical AND operation on the second local-frequency signal and the second adjusted signal to output the second radio-frequency signal.

12. The method according to claim 9, wherein performing phase delay on the first local-frequency signal to obtain the third delay signal, and inputting the third delay signal to a third D flip flop as a third clock signal;

performing phase adjustment on the second digital baseband signal according to triggering of the third clock signal, to output the third adjusted signal;

performing phase delay on the second local-frequency signal to obtain the fourth delay signal, and inputting the fourth delay signal to a fourth D flip flop as a fourth clock signal; and performing phase adjustment on the second digital baseband signal according to triggering of the fourth clock signal, to output the fourth adjusted signal.

13. The method according to claim 9, further comprising:

performing a logical AND operation on the first local-frequency signal and the first adjusted signal, to generate the first radio-frequency signal;

performing a logical AND operation on the second local-frequency signal and the fourth adjusted signal, to generate the fourth radio-frequency signal; and performing a logical OR operation on the first radio-frequency signal and the fourth radio-frequency signal, to output the first radio-frequency output signal;

performing a logical AND operation on the first local-frequency signal and the third adjusted signal, to generate the second radio-frequency signal; performing a logical AND operation on the second local-frequency signal and the second adjusted signal, to generate the third radio-frequency signal; and performing a logical OR operation on the second radio-frequency signal and the third radio-frequency signal, to output the second radio-frequency output signal.

* * * * *